United States Patent

Nagaraj

[11] Patent Number: 6,052,000
[45] Date of Patent: Apr. 18, 2000

[54] MOS SAMPLE AND HOLD CIRCUIT

[75] Inventor: Krishnasawamy Nagaraj, Somerville, N.J.

[73] Assignee: Texas Instruments Incorporated, Dallas, Tex.

[21] Appl. No.: 09/069,495

[22] Filed: Apr. 29, 1998

Related U.S. Application Data

[60] Provisional application No. 60/045,182, Apr. 30, 1997.
[51] Int. Cl.[7] .......................... G11C 27/02; H03K 17/00; H03K 5/00
[52] U.S. Cl. ................................ 327/94; 327/91; 327/95; 341/122
[58] Field of Search .................................. 327/91, 94, 95; 341/122

[56] References Cited

U.S. PATENT DOCUMENTS 5,479,121  12/1995  Shen et al. ................................. 327/94
5,570,048  10/1996  Rijns ......................................... 327/94

Primary Examiner—Timothy P. Callahan
Assistant Examiner—Cassandra Cox
Attorney, Agent, or Firm—Warren L. Franz; Wade James Brady, III; Frederick J. Telecky, Jr.

[57] ABSTRACT

A MOS track-and-hold circuit incorporating cancellation of error due to switch feedthrough is described. To eliminate the channel charge feedthrough due to oxide capacitance, a switched capacitor source (22) is connected to be charged to a voltage V1 during the "hold" phase and between the input node (12) and the switch gate (17) to provide a voltage V1−Vin during the "track" phase. A dummy transistor (26) biased in an "off" condition has its drain connected to the holding capacitor (15) and its gate switched between ground and the output terminal (Vout which tracks Vin) to also cancel the feedthrough from the gate-drain overlap capacitance and any gate-drain parasitic capacitance.

14 Claims, 1 Drawing Sheet

MOS SAMPLE AND HOLD CIRCUIT

This application claims priority under 35 USC § 119(e)(1) of provisional application Serial No. 60/045,182 filed Apr. 30, 1997, the entirety of which is incorporated herein by reference.

This invention relates generally to sample-and-hold and track-and-hold circuits (hereinafter collectively referred to as "sample-and-hold" circuits) and, in particular, to sample-and-hold circuits utilizing MOS transistor switches.

BACKGROUND OF THE INVENTION

Sample-and-hold circuits are used for sampling values of continuous time-varying amplitude signals at discrete time intervals. The sampling may, for example, be done as part of an analog-to-digital signal conversion process, wherein amplitude values of an analog input signal are sampled at regular clocked time intervals for conversion into binary digital values, to give a digital output representation of the time-varying input. Digital signal processing may then be readily applied to the converted signal before converting the processed signal back into analog form for control or other purposes. In a typical application, the rate of sampling must at least be equal to twice the highest relevant frequency component (viz. bandwidth) of the original signal (the Nyquist frequency) in order to accurately capture the meaningful information.

A conventional sample-and-hold circuit 10 is shown schematically in FIG. 1. A continuous, time-varying voltage signal Vin applied at input terminal 12 is connected through a switch 14 to charge a hold capacitor 15 (Ch), one terminal of which is connected to an output buffer 16 and the other terminal of which is connected to ground. Output buffer 16 may, for example, be a unity gain amplifier. Switch 14 is controlled by a sample-and-hold timing (or clocking) signal applied at node 17, so that when switch 14 is switched "on," the voltage at capacitor node 19 (and hence the output voltage Vout at output node 21) tracks the voltage applied at input node 12, and when switch 14 is switched "off," the last voltage applied at input node 12 is "held" at node 19 (and thus at node 21) by the charge on capacitor 15.

Switch 14 is often implemented as a MOS (metal-oxide semiconductor) transistor. When switch 14 is implemented as an NMOS transistor, for example, the input voltage Vin is passed through the N channel when a high gate voltage (e.g., Vdd) is applied at node 17 ("phase A") and is blocked when a low gate voltage (e.g., ground) is applied at node 17 ("phase B"). This causes Vout to track the varying magnitude of Vin during phase A (i.e., Vout=Vin), but "hold" the last phase A value of Vin during phase B (i.e., Vout=Vin ($t_r$)). There are, however, two types of capacitance inherent in the MOS transistor that contribute along with the pass-through input voltage Vin to the captured charge at node 19 when the transistor is turned "off." One is the gate-oxide capacitance (Cox). The other is the gate-drain parasitic capacitance (Cgd). Capacitance Cox is the capacitance caused by locating the metal and dielectric oxide directly over the channel. When the MOS transistor is "on," in order for current to flow, charge is present at the surface of the channel, under the oxide. When the same transistor is then turned "off," that charge must be dissipated, some going to the drain and some going to the source. This affects the charge stored on capacitor 15 (voltage "held" at node 19) when switch 14 is turned "off." The charge contribution of Cox is proportional to Vin×Cox, where Cox is the gate oxide capacitance of transistor 14. Capacitance Cgd is a parasitic capacitance due to physical overlap between the gate and drain terminals, as well as from any coupling between the gate and drain connections, in the MOS transistor layered structure. (Where source rather than drain is connected to node 19, the terms "drain" and "Cgd" should be understood to include "source" and "Cgs" in the context of this discussion and the described invention.) Capacitance Cgd exists whether the transistor is turned "on" or "off" and, thus, also contributes to the charge stored on capacitor 15 (voltage "held" at node 19) when switch 14 is turned "off." The charge contribution of Cgd is proportional to Vin×Cgd, where Cgd is the gate-to-drain parasitic capacitance of transistor 14.

Because the input signal is voltage magnitude time-variant, the influence on the "held" voltage of sample-and-hold circuit 10 due to Cox and Cgd is a function of the input voltage. Capacitance Cox depends on the difference between the applied gate voltage and the voltage at node 19. For example, 3.0 volts may be applied to the gate to turn transistor 14 "on"; however, when transistor 14 is "on," the voltage at node 19 will track the (varying) voltage at input node 12. Thus, the amount of charge distributed due to Cox and Cgd at node 19 when the transistor is turned "off" will vary with the level of the input voltage. If the effect of Cox and Cgd on the captured value were constant each time the transistor were turned "off" to "hold" the sample, it could be readily taken into account. It would simply be a constant voltage "pedestal" that would raise or lower the signal by the same amount. But, because the amount of influence on the captured signal varies non-linearly as a function of the magnitude of the input signal, it causes a problem. With decreasing channel dimensions, the influence of Cox on the "held" value is lessening; however, the influence of Cgd is becoming more significant. There exists, therefore, a need to compensate for the adverse effects of Cox and Cgd in sample-and-hold circuits.

SUMMARY OF THE INVENTION

The invention provides a method and apparatus for reducing the time-varying deleterious effects of gate-to-channel (Cox) and overlap (Cgd) capacitance in MOS transistor sample-and-hold (i.e. sample-and-hold and track-and-hold) circuits. The invention further provides sample-and-hold circuits incorporating such features.

BRIEF DESCRIPTION OF THE DRAWINGS

Embodiments of the invention have been chosen for purposes of illustration and are described with reference to the accompanying drawings wherein.

Throughout the drawings, like reference numerals are used to refer to like elements.

DETAILED DESCRIPTION

Figure 1:
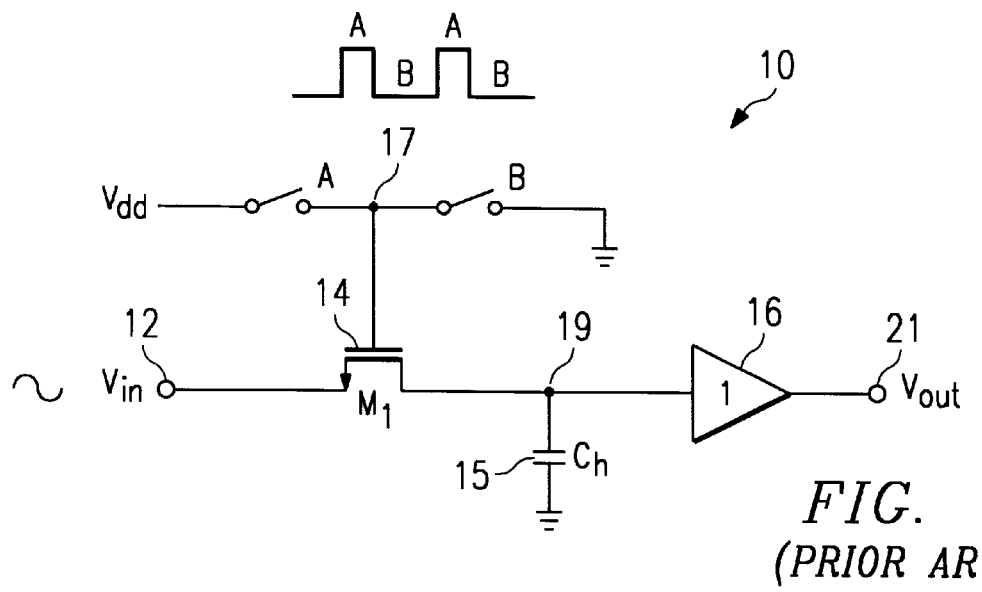
FIG. 1 (prior art) is a schematic view of a conventional sample-and-hold circuit.
Figure 2:
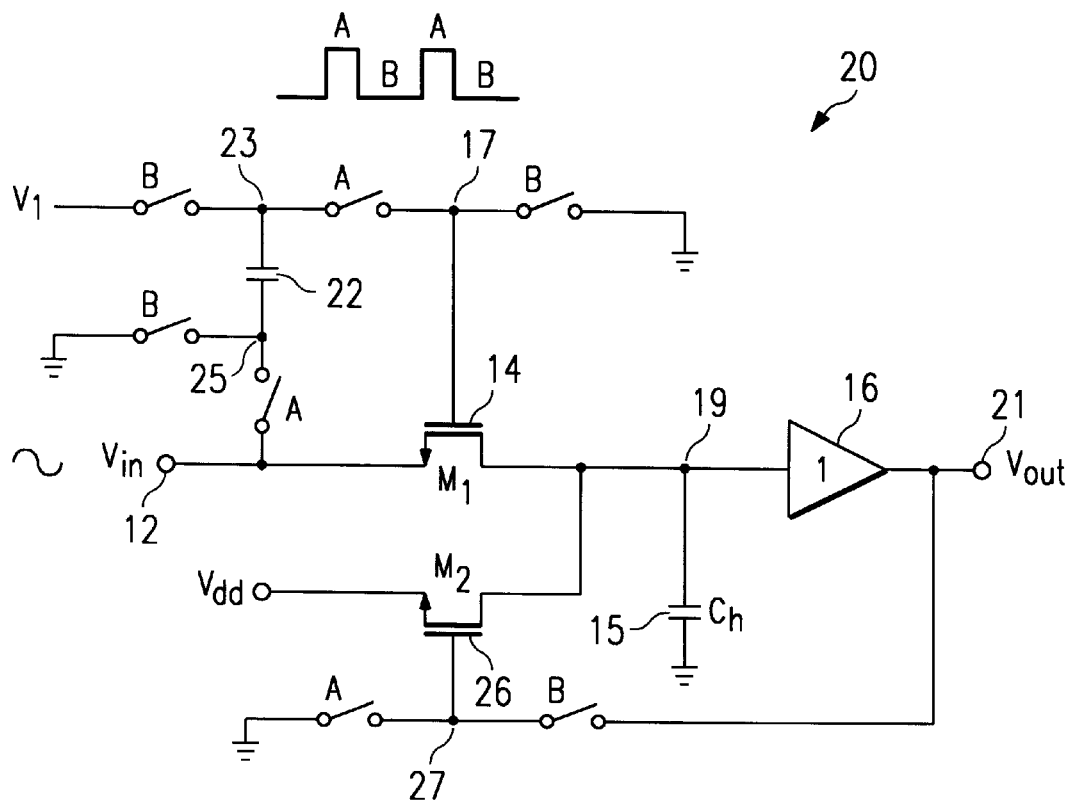
FIG. 2 is a schematic view of a sample-and-hold circuit in accordance with the principles of the invention.

FIG. 2 shows a sample-and-hold (viz. track-and-hold) circuit 20 having a continuous, time-varying voltage signal Vin applied to an input terminal 12 connected, as before, through a MOS transistor switch 14 to charge a capacitor 15, one terminal (node 19) of which is connected to an output buffer 16 in the form of a unity gain amplifier, and the other terminal of which is connected to ground. However, in departure from the arrangement in circuit 10 of FIG. 1, instead of connecting the gate node 17 of transistor 14 alternately between a supply voltage Vdd (e.g., 3.0 volts) at phase A and ground at phase B, node 17 is alternately connected between a voltage V1+Vin at phase A and ground at phase B. This is accomplished in the illustrated embodiment by providing a capacitor 22 having terminals 23 and 25 that are switched across voltage source terminals V1 and ground during phase B and across gate node 17 and input node 12 during phase A. Capacitor 22 is, thus, charged to voltage V1 during phase B, when switch 14 is turned off. Then, during phase A, when capacitor 22 is switched over to gate node 17 it will apply a gate-to-source overdrive voltage differential ((V1+Vin)−Vin=V1) which is independent of the applied input voltage V1. Thus, the channel charge injected into hold capacitor 15 when "hold" mode phase B is entered will also be independent of variations in Vin. This removes non-linearities due to Cox. However, the charge injection due to the gate-to-drain parasitic capacitance Cgd is still dependent on Vin. And, with the trend toward shorter and shorter channel lengths, Cgd becomes comparable to Cox. Thus, there remains a need to cancel the non-linear charge injection component due to Cgd.

Circuit 20 does this by the addition of a "dummy" MOS transistor 26, connected as shown in FIG. 2 to negate the effect of charge injection due to the parasitic capacitance of transistor 14. Transistor 26 is formed with structural parameters (viz. channel length, channel width, oxide thickness, layer overlap, etc.) that match (at least from a parasitic capacitance contribution standpoint) those of transistor 14. Transistor 26 has its source connected to a voltage Vdd, its drain connected to node 19, the source, drain and path therebetween defining a current path, and its gate connected to node 27 which is switched between ground at phase A and the output voltage Vout at phase B. Because output buffer 16 is a unity gain amplifier, Vout will be the same as the voltage at node 19 (approximately equal to Vin during and at the end of phase A). Voltage Vdd is chosen relative to the anticipated values of Vin so that the gate voltage of transistor 26 will never be higher than its source or drain voltage, either in phase A or in phase B. Consequently, transistor 26 will always be "off." However, when the circuit switches from "track" phase A to "store" phase B, the gate of transistor 26 will see a transition that is equal and opposite to that seen by transistor 14. This cancels the effect on the stored value of non-linear charge feedthrough due to the drain-gate parasitic capacitance.

What is claimed is:

1. A method for reducing the time-varying effects of overlap capacitance in a sample-and-hold circuit having a time-varying input voltage applied to an input terminal through a MOS transistor switch to charge a hold capacitor, a terminal of the hold capacitor connected to supply an output voltage; the method comprising:

connecting a gate of the transistor switch to a first voltage to turn the switch on during a first "track" phase of operation, and to a second voltage to turn the switch off during a second "hold" phase of operation;

providing a dummy MOS transistor having a current path connected to said terminal of said hold capacitor; and connecting a gate of the dummy MOS transistor to the second voltage during the first phase of operation and to the output voltage during the second phase of operation.

2. The method of claim 1, wherein the MOS transistor switch and dummy MOS transistor comprise NMOS transistors, and the second voltage is ground.

3. The method of claim 1, for also reducing the time-varying effects of gate-to-channel capacitance in the sample-and-hold circuit; wherein the transistor switch gate connecting step comprises connecting the transistor switch gate during the first phase of operation to the first voltage equal to the sum of an input voltage-independent voltage and the input voltage.

4. The method of claim 3, wherein the transistor switch gate connecting step further comprises charging a second capacitor to the input voltage-independent voltage during the second phase of operation, and connecting the charged second capacitor between the input terminal and the transistor switch gate during the first phase of operation.

5. The method of claim 4, wherein the MOS transistor switch and dummy MOS transistor comprise NMOS transistors, and the second voltage is ground.

6. A sample-and-hold circuit, comprising:

an input terminal for receiving an input voltage;

a hold capacitor, a terminal of the hold capacitor connected for supplying an output voltage;

a MOS transistor switch connected to selectively apply the input voltage from the input terminal to charge the hold capacitor responsive to voltage at a gate of the transistor switch;

control circuitry for connecting the gate of the transistor switch to a first voltage to turn the switch on during a first "track" phase of operation, and to a second voltage to turn the switch off during a second "hold" phase of operation;

a dummy MOS transistor having a current path connected to the hold capacitor; and other control circuitry for connecting a gate of the dummy MOS transistor to the second voltage during the first phase of operation and to the output voltage during the second phase of operation.

7. The circuit of claim 6, wherein the MOS transistor switch and dummy MOS transistor comprise NMOS transistors, and the second voltage is ground.

8. The circuit of claim 6, further comprising the control circuitry for connecting the gate of the transistor switch being connected and configured for connecting the transistor switch gate to the first voltage equal to the sum of an input voltage-independent voltage and the input voltage during the first phase of operation.

9. The circuit of claim 8, wherein the control circuit for connecting the transistor switch gate further comprises a second capacitor, and means charging the second capacitor to the input voltage-independent voltage during the second phase of operation and for connecting the charged second capacitor between the input terminal and the transistor switch gate during the first phase of operation.

10. The circuit of claim 9, wherein the MOS transistor switch and dummy MOS transistor comprise NMOS transistors, and the second voltage is ground.

11. A sample-and-hold circuit, comprising:

an input terminal for receiving an input voltage;

a first NMOS transistor having a source connected to the input terminal, a gate and a drain;

a hold capacitor connected between the first NMOS transistor drain and ground, the hold capacitor supplying an output voltage;

first control circuitry for selectively connecting the first NMOS transistor gate alternately to a first voltage source to turn the first transistor on and to ground to turn the first transistor off;

a second NMOS transistor having a drain connected to the first NMOS transistor drain, a gate and a source; and second control circuitry for selectively connecting the second NMOS transistor gate alternately to ground when the first transistor is on and to the output voltage from the hold capacitor when the first transistor is off.

12. The circuit of claim 11, wherein the first control circuitry comprises circuitry for selectively connecting the first NMOS transistor gate alternately to the input terminal through an input voltage-independent voltage source when the first transistor is on, and to ground when the first transistor is off.

13. The circuit of claim 12, wherein the input voltage-independent voltage source comprises a second capacitor, and circuitry selectively connecting the second capacitor between the first NMOS transistor gate and the input terminal and, alternately, between terminals of a supply of fixed voltage.

14. The circuit of claim 13, further comprising an output terminal, a unity gain amplifier having an input connected to the first NMOS transistor drain and having an output connected to the output terminal; and wherein the second control circuitry comprises circuitry for selectively connecting the second NMOS transistor gate alternately to ground and to the output terminal.

\* \* \* \* \*